United States Patent [19]
Dobler et al.

[11] 3,984,581
[45] Oct. 5, 1976

[54] METHOD FOR THE PRODUCTION OF ANTI-REFLECTION COATINGS ON OPTICAL ELEMENTS MADE OF TRANSPARENT ORGANIC POLYMERS

[75] Inventors: Hermann R. Dobler, Aalen; Rudolf Eichinger, Oberkochen, both of Germany

[73] Assignee: Carl Zeiss-Stiftung, Oberkochen, Germany

[22] Filed: Oct. 22, 1974

[21] Appl. No.: 517,048

Related U.S. Application Data
[63] Continuation-in-part of Ser. No. 336,504, Feb. 28, 1973, abandoned.

[52] U.S. Cl.................................. 427/35; 350/164; 350/165; 427/10; 427/42; 427/164; 427/166; 427/167; 427/248 B; 427/248 I; 427/419 A; 427/419 B
[51] Int. Cl.² ........................ G02B 1/10; B05D 3/06; B05D 5/06
[58] Field of Search ............ 350/164, 165; 427/164, 427/166, 42, 248, 35, 419 A, 419 B, 167

[56] References Cited
UNITED STATES PATENTS

| | | | |
|---|---|---|---|
| 2,331,716 | 10/1943 | Nadeau | 350/164 |
| 2,553,289 | 5/1951 | Alexander | 427/35 |
| 2,641,954 | 6/1953 | Schorf | 350/164 |
| 3,271,179 | 9/1966 | Smith | 427/166 |
| 3,356,522 | 12/1967 | Libbert | 350/164 |
| 3,373,278 | 3/1968 | Cilyo | 427/428 |
| 3,706,485 | 12/1972 | Fawcett | 350/164 |
| 3,804,491 | 4/1974 | Morokuma | 350/164 |

FOREIGN PATENTS OR APPLICATIONS

| | | | |
|---|---|---|---|
| 863,922 | 2/1971 | Canada | 427/42 |
| 834,490 | 3/1952 | Germany | |
| 841,625 | 6/1952 | Germany | |
| 916,975 | 8/1954 | Germany | |
| 1,204,048 | 10/1965 | Germany | |

OTHER PUBLICATIONS
Strong, *Concepts of Classical Optics*, pp. 251–252, W. H. Freeman & Co., San Francisco, 1958.

Kennedy et al., "Gas Scattering and Ion–Plating Deposition Methods", Research/Development, vol. 22, No. 11 (1971), pp. 40–44.

*Primary Examiner*—William H. Schmidt
*Attorney, Agent, or Firm*—Nichol M. Sandoe

[57] ABSTRACT

A method for the production, without thermal treatment, of an anti-reflection coating on surfaces of optical elements of transparent, thermally sensitive material such as organic polymeric plastic material which comprises coating the surface with a layer of silicon oxide by vaporizing said silicon oxide by applying the energy of an electron beam thereto under vacuum in such manner that the vaporized molecules are ionized by said beam and are deposited on said elements in ionized condition. A multi-layer coating may then be applied by depositing with an increasing rate on said coating a layer of a substance of higher refractive index than that of said plastic material while continuing the deposition of the silicon oxide, and then depositing thereon a final layer of anti-reflection material such as silicon oxide. The substance of higher refractive index may an oxide of cerium, tantalum, titanium or zirconium.

4 Claims, 3 Drawing Figures

METHOD FOR THE PRODUCTION OF ANTI-REFLECTION COATINGS ON OPTICAL ELEMENTS MADE OF TRANSPARENT ORGANIC POLYMERS

This application is a continuation-in-part of prior application Ser. No. 336,504, filed Feb. 28, 1973, now abandoned.

SUMMARY OF THE INVENTION

This invention relates to a method for the production of an anti-reflection coating on optical elements of transparent, thermally sensitive material, especially organic polymeric plastic materials.

The surface of all optical elements reflect a certain amount of the incident light, which is detrimental to the effect of these elements.

It is routine practice to deposit an anti-reflection coating on optical elements of glass of which the structure and dimensions are such as to reduce considerably the percentage of reflected light. If the coating is exposed to mechanical and atmospheric influence, as spectacle lenses are, it has to meet severe demands. The coating must be hard, adhesive, absorption-free, chemically constant and stable under the extreme conditions of temperature experienced in tropical climates. Furthermore, it should have a low residual reflection and low angle dependence of the residual reflection.

An anti-reflection coating of $MgF_2$ fulfils the above mentioned conditions if the optical element is preheated to a temperature of 300°C. It is therefore normal to coat optical elements of glass by depositing on the preheated surfaces, preferably by thermal evaporation, a layer of $MgF_2$.

In the optical industry, transparent plastic material, i.e. organic polymers, are being used to an increasing extent for the manufacture of optical elements. Thus, it is well known to make spectacle lenses of plastic material such as allyl diglycol carbonate, commonly known as CR 39, for example.

It is also desirable to coat optical lenses made of such plastic material with anti-reflection coatings. However, the $MgF_2$ coating usually applied to glass elements cannot be used here, because plastic materials do not withstand without damage high temperatures necessary in the use of the known thermal process of coating.

There are other examples of optical elements which require anti-reflection coatings which cannot be subjected to such high temperatures without damage. Thus, in the case of cemented optical lenses of glass, the cement is only stable up to a temperature of about 90°C. Also, in the case of aspheric lenses in which a thin film of plastic material having an aspheric free surface is deposited on a spherical glass lens, the use of such high temperatures would distort the aspheric surface.

It is an object of the present invention to provide a method for the production of an anti-reflection coating on optical elements consisting in whole or in part of transparent, thermally sensitive material, especially organic polymeric plastic materials, which is adhesive, hard, absorption-free, chemically constant and stable under the extreme conditions of temperatures experienced in tropical climates and which has a low residual reflection and a low angle dependence of the residual reflection, and which can be applied to such elements at normal room temperatures, i.e. without preheating said elements.

According to the present invention, first silicon oxide is vaporized by applying the energy of an electron beam thereto under vacuum in such manner that the vaporized molecules released thereby move on their way to said optical elements through the electron beam so that a substantial portion of the vaporized molecules are ionized thereby. The ionized molecules are thereafter deposited on the surfaces of the optical elements in ionized condition. The optical elements need not be preheated, i.e. they are at room temperature at the beginning of the coating process when the silicon oxide is applied, and they become only slightly warmed during the subsequent processing by radiation from the heated coating materials and by energy received from the deposited molecules. For example, according to the present method, the temperature of the coated elements at the end of the processing seldom exceeds 40°C. Nevertheless, it is found that the ionized vapor molecules adhere strongly to the surfaces being coated.

As explained, first a thin layer of a silicon oxide, as for example, $SiO$, $SiO_2$ or $Si_2O_3$, is applied to the surface to be coated. However, the use of $SiO_2$ is preferred for most purposes, and especially for use for spectacle lenses, because of the possibility of oxidation of $SiO$ and $Si_2O_3$ when exposed to ultra violet radiation such as exists in normal sunlight. This first layer is strongly adherent to the surfaces. However, since the refractive index of silicon oxide does not differ significantly from that of the optical elements, it does not, as such, produce a completely effective reduction of reflection. Accordingly, building up on said silicon oxide layer by continuously or discontinuously adding absorption free substances with a higher refractive index an inhomogeneous layer is produced, the refractive index of its surface being increased to a value which is higher than that of the optical element. A substance with higher refractive index may be used, for example, oxides of cerium, tantalum, titanium or zirconium.

The refractive index of the surface of said inhomogeneous layer is significantly higher than that of silicon oxide, so that a completely effective reduction of reflection is effected by finally producing an outer λ/4 thick layer of silicon oxide. The coating of the optical elements may, for example, be effected in the following way. At the beginning of the processing, after a short interval during which only silicon oxide is applied, the application of the second coating material of higher refractive index begins and is increased, while the application of the silicon oxide remains constant or is decreased, so that a mixture of the two materials is used to form a non-homogeneous layer. In the formation of the outer layer, the application of the second coating material is stopped so that the outer layer is a homogeneous layer of silicon oxide. The production of said coating may be effected by heating silicon oxide by means of a first electron beam at a constant rate during the whole process. During the production of said inhomogeneous layer, the material of higher refractive index may also be evaporated by means of an electron beam in such a manner that the vaporized molecules released thereby on their way to said optical element move through the electron beam so that a portion of the vaporized molecules are ionized thereby.

The heating of the material of higher refractive index may be effected by a second electron beam. It is, however, also possible to use only one electron beam to heat both substances. This is effected by controlling this electron beam so that it alternately impinges upon said two substances. During its impingement upon the silicon oxide the beam intensity and the impingement time remains constant, while during its impingement upon the substance with higher refractive index the beam intensity and/or the impingement time is increased step by step.

BRIEF DESCRIPTION OF THE DRAWINGS

The new method is now explained in greater detail by means of an embodiment illustrated in FIGS. 1 to 3 of the accompanying drawings.

DETAILED DESCRIPTION

Figure 1:
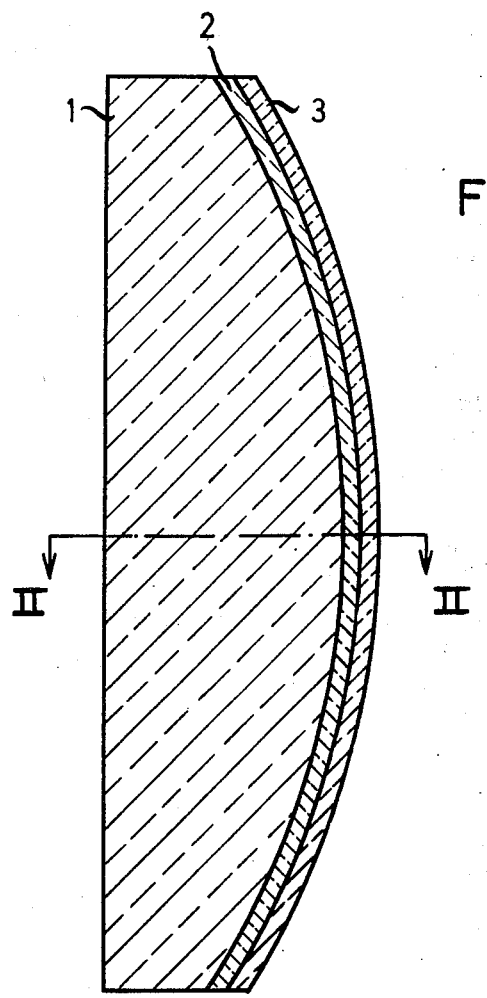
FIG. 1 is a much enlarged cross section through a lens of plastic material coated with layers according to the new method, but in which the layers are not to scale.

Referring to FIG. 1, a lens 1 of an organic polymeric plastic material such as allyl diglycol carbonate (CR 39), for example, is shown to which an anti-reflection coating has been applied.

As heretofore explained, this anti-reflective coating actually comprises three layers, (1) an extremely thin layer or film of a silicon oxide ($SiO_2$), (2) an inhomogeneous layer 2 with increasing refractive index, and (3) an outer layer 3 of a silicon oxide having a thickness of $\lambda/4$ wherein $\lambda$ is a wavelength of light within the range for which the coating is to be effective. However, since the first layer is so extremely thin as not to be readily depicted, only the second layer 2 and the third layer 3 are shown in the drawing. As explained, the layer 2 need not be homogeneous throughout, but may comprise varying proportions of silicon oxide and the material of higher refractive index.

Figure 2:
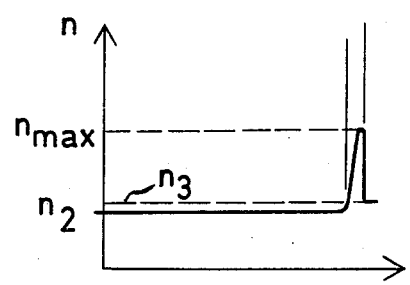
FIG. 2 shows the course of the refractive indices along the section II—II of the lens shown in FIG. 1.

As is shown in FIG. 2, the refractive index of the material of the lens 1 is $n_2$; the refractive index of silicon oxide is designated $n_3$. The layer 2 has an increasing refractive index which reaches at the surface of this layer the value $n_{max}$. The value $n_{max}$ more or less corresponds to the square of refractive index $n_3$. In this way, an optimum anti-reflection effect is achieved when the outer layer 3 with the refractive index $n_3$ is $\lambda/4$ thick.

Figure 3:
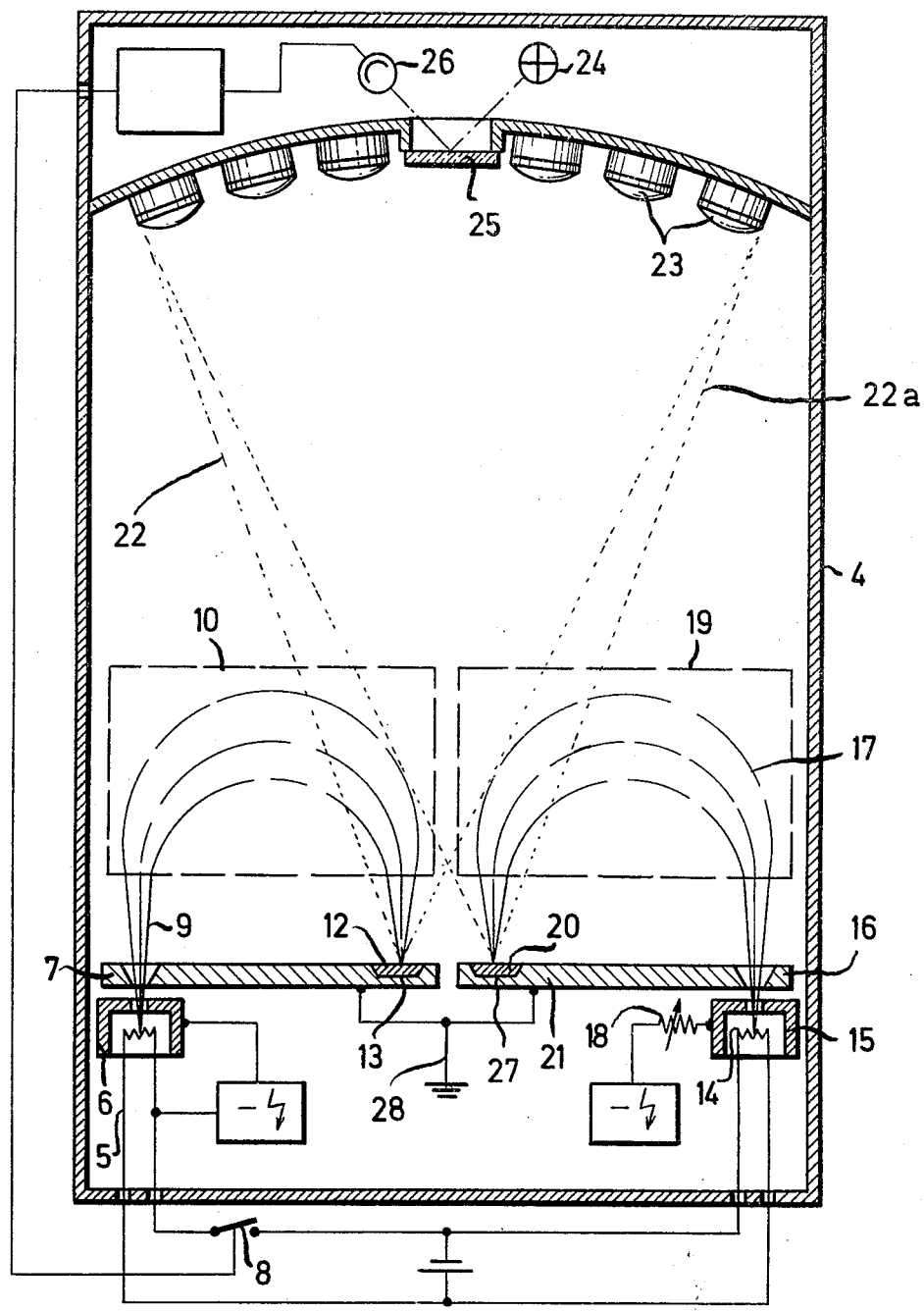
FIG. 3 is a semi-diagrammatic view of an apparatus suitable for practicing the method of the invention.

Referring to FIG. 3, the apparatus comprises a closed chamber 4 within which, near the top of the chamber, one or more optical elements which are to be coated, such as the lenses 23, may be mounted in any suitable manner. Also mounted within the chamber 4 is a first electron beam source of conventional construction, the essential elements of which comprise a cathode 5, a control electrode 6 for focusing the beam, and an anode 7 which is grounded as at 28. A cup-shaped depression 13 in the anode 7 is filled with a coating material 12 such as $SiO_2$, for example. Interposed between the said electron beam source and the coating material 12 is a magnetic field indicated diagrammatically by broken lines 10, which is generated in any suitable conventional manner, and which deflects the beam throughout an angle of 180°, for example, as here illustrated, and also focusses the beam onto the coating material 12.

Thus, when the switch 8 is closed, an electron beam 9 is generated which is focused and deflected to cause it to impinge at high energy density on the coating material 12. As will be understood, the energy supplied to the material 12 vaporizes the material. It will be noted, however, that as the vaporized molecules which are released move through the chamber along paths indicated by dotted lines 22 to be deposited on the exposed surfaces of the lenses 23, a substantial portion of the molecules moves through the deflected beam and is ionized thereby. The ionized molecules are deposited on the surface in ionized condition and adhere strongly thereto.

A second electron beam source, which duplicates the said first source, comprises a cathode 14, a control electrode 15 for focusing the beam, and an anode 16 which is also grounded at 28. In this case, the intensity of the beam may be varied by the variable resistance 18 coupled to the electrode 15. Interposed between the said electron beam source and the coating material 20 is a magnetic field indicated diagrammatically by broken lines 19, generated in any suitable conventional manner, which deflects the beam 17 as previously described. In this case, the cup shaped depression 27 in the anode 16 is filled with a second coating material 20 such as ZrO, for example.

Thus, when the switch 8 is closed a second electron beam 17 is generated which is focused and deflected to impinge at high energy density on the coating material 20. In this case, however, the intensity of the beam may be varied from zero to the desired maximum by suitable adjustment of the variable resistance 18.

In this case, as previously described, a substantial portion of the vaporized molecules released by the beam energy moves through the beam 17 along paths indicated by dotted lines 22a, is ionized thereby, and is deposited on the surfaces in ionized condition.

EXAMPLE

A specific example of the practice of the process is as follows:

The coating material 12 is $SiO_2$. The coating material 20 is ZrO. The optical elements 23 to be coated are spectacle lenses made of allyl diglycol carbonate, i.e. CR 39. The lenses should be cleaned thoroughly by washing with acetone. After the lenses 23 are arranged in proper position, the chamber 4 is evacuated to about $10^{-4}$ Torr. At this pressure, the mean free path of the vapor molecules is about 0.7 m. The distance between the coating materials and the lenses 25 is about 0.5 m, i.e., it is shorter than the mean free path of the vapor molecules. The switch 8 is then closed and energy of the electron beam 9 is applied to the material 12 for a period of 10 seconds. During this period, the variable resistance 18 is set so that no beam energy is applied to the coating material 20. As a result, during the 10 second period, a thin homogeneous coating of $SiO_2$ only is applied to the lenses 23.

At the end of the 10 second period, the variable resistance 18 is adjusted to apply electron beam energy to the coating material 20, while the coating material 12 continues to have energy applied thereto, so that the layer 2 comprises a mixture of coating material 12 and coating material 20. This mode of operation is continued for 3 minutes during which time the variable resistance 18 is varied to increase the intensity of the electron beam 17 to thereby increase the rate of evaporation of the coating material 20. At the end of the 3 minute period, the variable resistance 18 is adjusted to discontinue the application of energy to the coating material 20, while energy continues to be applied to the coating material 12 until the layer 3 of $SiO_2$ reaches the desired thickness of $\lambda/4$, which usually requires a period of only about 20 seconds, at which time the switch 8 is opened.

If desired, the closing of the switch 8 may be effected automatically. Thus, light from a light source 24 may be caused to impinge upon and be reflected by a glass plate 25, located in the top wall of the chamber 4, onto a photoelectric cell 26. The glass plate receives the same coatings as those received by the photoelectric cell 26 reaches a predetermined minimum, the switch 8 may be opened automatically by conventional means by a signal from the cell 26.

What is claimed is:

1. A method for the production of an anti-reflection coating on a surface of a spectacle lens made of allyl diglycol carbonate without preheating said surface, which comprises vaporizing silicon oxide continuously at a constant rate under vacuum by heating with an electron beam, deflecting said beam on its way to said silicon oxide so as to cause the vaporized molecules released thereby to move on their way to said lens through said electron beam whereby a substantial portion of the vaporized molecules is ionized, depositing a layer of said vaporized silicon oxide molecules at a constant rate on the surface of said lens in ionized condition, thereafter vaporizing an absorption-free substance of higher refractive index under vacuum by heating with an electron beam with an increasing evaporation rate while continuing the vaporization of said silicon oxide at a constant rate throughout the vaporizing of said absorption free substance of higher refractive index, thus depositing on said layer of silicon oxide an inhomogeneous layer of progressively increasing refractive index comprising silicon oxide and said substance of higher refractive index extending throughout the layer which increases the refractive index of said layer to a value which is higher than that of said lens but less than that of said substance, and finally stopping vaporization of said substance of higher refractive index while continuing to vaporize silicon oxide alone until an outside layer of silicon oxide which reaches a thickness of $\lambda/4$ is deposited on said inhomogeneous layer.

2. The method according to claim 1 in which the vaporization of said substance of higher refractive index is effected by heating said substance with an electron beam, deflecting said beam on its way to said substance so as to cause the vaporized molecules released thereby to move on their way to said element through said electron beam whereby a portion of the vaporized molecules is ionized and depositing said vaporized molecules on the surface of said element in ionized condition.

3. The method according to claim 2 in which the vaporization of said substance of higher refractive index is effected by heating with a second electron beam.

4. The method according to claim 1 in which the second coating material of higher refractive index is an oxide of cerium, tantalum, titanium or zirconium.

* * * * *